(12) United States Patent
Gu

(10) Patent No.: US 9,337,352 B1
(45) Date of Patent: May 10, 2016

(54) FLOATING GATE FLASH MEMORY DEVICE AND COMPILATION METHOD THEREOF

(71) Applicant: Shanghai Huali Microelectronics Corporation, Shanghai (CN)

(72) Inventor: Jinglun Gu, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 0 days.

(21) Appl. No.: 14/753,220

(22) Filed: Jun. 29, 2015

(30) Foreign Application Priority Data

Mar. 23, 2015 (CN) .......................... 2015 1 0128242

(51) Int. Cl.
| | |
|---|---|
| H01L 29/788 | (2006.01) |
| G11C 16/06 | (2006.01) |
| H01L 29/78 | (2006.01) |
| H01L 29/423 | (2006.01) |
| H01L 29/10 | (2006.01) |
| H01L 29/08 | (2006.01) |

(52) U.S. Cl.
CPC ............ *H01L 29/7885* (2013.01); *G11C 16/06* (2013.01); *H01L 29/0847* (2013.01); *H01L 29/1033* (2013.01); *H01L 29/42324* (2013.01); *H01L 29/42364* (2013.01); *H01L 29/7831* (2013.01)

(58) Field of Classification Search
CPC ............ H01L 29/7885; H01L 29/0847; H01L 29/1033; H01L 29/4232; G11C 16/06
USPC ....................................................... 365/185.18
See application file for complete search history.

(56) References Cited

U.S. PATENT DOCUMENTS 5,300,803 A * 4/1994 Liu ........................ H01L 27/115
257/316

* cited by examiner

*Primary Examiner* — Hoai V Ho
*Assistant Examiner* — Tri Hoang

(57) ABSTRACT

The present invention discloses a floating gate flash memory device, comprising: a P-type substrate which has a source and a drain, and a first polysilicon gate, a first control gate and a second polysilicon gate and a second control gate which are respectively located in parallel on the upper and lower sides of the substrate, first and second polysilicon floating gates being respectively provided between the first and second control gates and the substrate; the floating gate flash memory device of the present invention utilizes a double-gate structure, can solve the problems such as the poor programming efficiency of the floating gate flash memory and the high programming current power consumption, by using the compilation mechanism of source side injection.

18 Claims, 1 Drawing Sheet

--Prior Art--

FLOATING GATE FLASH MEMORY DEVICE AND COMPILATION METHOD THEREOF

CROSS-REFERENCE TO RELATED APPLICATION

This application claims the priority benefit of China patent application serial No. 201510128242.3, filed Mar. 23, 2015. The entirety of each of the above-mentioned patent applications is hereby incorporated by reference herein and made a part of this specification.

FIELD OF THE INVENTION

The present invention relates to the field of semiconductor technology, and more specifically to a floating gate type double-gate flash memory device and a compilation method thereof.

BACKGROUND OF THE INVENTION

U.S. Pat. No. 5,300,803 A discloses a non-volatile memory structure having a compilation mechanism of SSI (Source Side Injection). This floating gate flash memory using SSI as the compilation mechanism effectively improves the injection efficiency of compilation, and reduces the power consumption. This flash memory device proposed in this patent was originally a new structure produced to solve the low injection efficiency and high power consumption of the floating gate flash memory device having a compilation mechanism of CHEI (channel hot electron injection).

Referring to FIG. 1, It can be seen from the portion above the double arrow in the diagram of FIG. 1 that, in a device of the original floating gate flash memory structure having a compilation mechanism of CHEI, in order to ensure a high generation rate of channel hot electrons, a high voltage must be applied to the drain. At the same time, in order to ensure a high efficiency of hot electron injection, a high voltage must be applied to the gate. The transverse electric field is decreased as the gate voltage increases. Similarly, the longitudinal electric field is increased as the gate voltage increases. Thus, in the device of the original floating gate flash memory structure having the compilation mechanism of CHEI, the high voltage must be applied to both of the drain and the gate. This leads to the low efficiency of channel hot electron injection and the high current power consumption. Consequently, the high gate voltage and the high drain voltage are in contradiction with each other.

Therefore, this patent (U.S. Pat. No. 5,300,803 A) invents a separately arranged gates flash memory device. As shown in the portion below the double arrow in the diagram of FIG. 1 (it is a schematic principle diagram of an existing floating gate flash memory using SSI as a compilation mechanism), the gate on the left is a control gate, and the gate on the right is a floating gate. The floating gate and the control gate are arranged in a staggered manner in space. A high voltage is applied to the floating gate, a low voltage is applied to the control gate, and a high voltage of 5v is applied to the drain. This can improve the injection efficiency of channel hot electrons, and reduce the current power consumption.

The floating gate flash memory structure of separately arranged gates disclosed in this patent has a problem in that: as a result of the relatively high voltage (5v) being applied to the drain, the width of the depletion layer of the drain which extends to the substrate is relatively large, and the source and the virtual depletion region are easy to come into contact with each other in the case of a high voltage, leading to device punchthrough and failure. This defect is easy to lead to device punchthrough and failure when the device size is reduced to 100 nm. For such a floating gate flash memory, there is no way to perform upgrade of technology node and critical dimension shrink in the process. Therefore, it is necessary to change the structure of this floating gate flash memory device, so that the upgrade of technology node and critical dimension shrink can be performed on it in the process.

At the same time, we will encounter a problem of threshold voltage drift during the dimension shrink of the flash memory. As pointed out in the literature "Modeling of Vth Shift in NAND Flash-Memory Cell Device Considering Crosstalk and Short-Channel Effects" [1], as the critical dimension of the flash memory is gradually decreased to a range of sub-100 nm or less, the short channel effect also appears gradually. This has an effect on the electrical characteristics of the memory device, and causes the threshold voltage thereof to drift to some extent as compared with the case of a long channel, leading to possible readout errors.

The double-gate MOSFET mentioned in the previous literatures is a device structure developed to cope with the short channel effect during the continuous shrink of the transistor dimension. When the channel dimension is reduced to less than 100 nm, due to its large gate-controlled area and strong electrostatic control ability, it is possible to effectively eliminate the short channel effect caused by the small dimension.

Also as described in the literature "Double-Gate Silicon-on-Insulator Transistor with Volume Inversion: A New Device with Greatly Enhanced Performance" [2], the double-gate MOSFET has excellent performance, and can achieve a large subthreshold slope, and a large transconductance and drain current. It is known that, due to the short channel effect, when the MOSFET dimension is reduced, the subthreshold slope will become smaller, leading to the incapability of shutoff of the device and a relatively large leakage current. With the double-gate structure, it is possible to effectively suppress the similar short channel effects, including the hot carrier effect, the threshold voltage drift effect, the DIBL (drain-induced barrier lowering) effect and the like. In summary, the double-gate MOSFET is one of the most powerful candidate device structures in the case in which the critical dimension of the MOSFET goes into sub-20 nm in the future.

[1] Sang-Goo Jung, Keun-Woo Lee, Ki-Seog Kim, Seung-Woo Shin, IEEE Transactions on Electron Devices, Volume: 55 Issue: 4, p. 1020, 2008

[2] Francis Balestra, Sorin Cristoloveanu, Mohcine Benachir, Jean Brini, and Tarek Elewa, IEEE EDL, volume 8, no. 9, p. 410, 1987

BRIEF SUMMARY OF THE DISCLOSURE

The present invention is directed to overcoming the above defects existing in the prior arts, provides a floating gate type double-gate flash memory device which utilizes a compilation mechanism of source side injection, and a compilation method thereof, and can achieve a memory of single bit, increase the storage density of the floating gate flash memory, reduce the critical dimension of the floating gate flash memory, decrease the current power consumption of the floating gate flash memory in programming, and thus can improve the efficiency of the floating gate flash memory in programming.

To achieve the above purpose, the technical scheme of the present invention is as follows:

A floating gate flash memory device, comprising:

a semiconductor substrate which includes an N-type doped source and drain located at both ends, and a P-type silicon channel located in the middle; and a first polysilicon gate, a first control gate and a second polysilicon gate and a second control gate which are respectively located in parallel on the upper and lower sides of the substrate between the source and drain, first and second polysilicon floating gates being respectively provided between the first and second control gates and the substrate, insulating layers being respectively provided between the polysilicon gates, control gates, polysilicon floating gates and substrate;

wherein, when the floating gate flash memory device performs compilation, by connecting the first and second polysilicon gates and applying a polysilicon gate voltage equal to a device threshold voltage to both of the first and second polysilicon gates, connecting the first and second control gates and applying the same control gate voltage higher than the device threshold voltage to both of the first and second control gates, and at the same time, applying a positive voltage to the drain, and applying a voltage of 0V to the source, a relatively thin channel electron layer is induced in a substrate area under the first and second polysilicon gates, and a relatively thick channel electron layer is induced in a substrate area under the first and second control gates, and, under the action of acceleration of the positive voltage of the drain, electrons induced from the polysilicon gates are accelerated to generate hot electrons, and under the action of the high voltage of the control gates, the hot electrons are injected into the floating gates to complete the compilation.

Preferably, the first and second polysilicon gates, the first and second control gates, the first and second polysilicon floating gates and the insulating layers are disposed symmetrically in geometric dimensions, on the upper and lower sides of the substrate between the source and drain.

Preferably, the thickness of the polysilicon gates is 80~120 nm, the thickness of the control gates is 30~60 nm, and the thickness of the polysilicon floating gates is 30~50 nm; the insulating layers have a width of 2~5 nm between the polysilicon gates and the control gates, polysilicon floating gates, have a thickness of 2~5 nm between the polysilicon gates, polysilicon floating gates and the substrate, and have a thickness of 8~15 nm between the control gates and polysilicon floating gates; the thickness of the substrate is 15~30 nm, the length of the channel is not greater than 50 nm, and the extended length of the source and drain is 8~15 nm.

Preferably, the material of the polysilicon gates, control gates and polysilicon floating gates is polysilicon, and the material of the insulating layers is silicon dioxide.

Preferably, when the floating gate flash memory device performs compilation, the first and second polysilicon gates are connected and are both applied with the same polysilicon gate voltage of 4~5V, the first and second control gates are connected and are both applied with the same control gate voltage of 9~12V, and at the same time, a voltage of 5~6V is applied to the drain, and a voltage of 0V is applied to the source.

A compilation method of a floating gate flash memory device, the floating gate flash memory device comprising: a semiconductor substrate which has an N-type doped source and drain located at both ends, and a P-type silicon channel located in the middle; and a first polysilicon gate, a first control gate and a second polysilicon gate and a second control gate which are respectively located in parallel on the upper and lower sides of the substrate between the source and drain, first and second polysilicon floating gates being respectively provided between the first and second control gates and the substrate, insulating layers being respectively provided between the polysilicon gates, control gates, polysilicon floating gates and substrate;

the compilation method comprising: with a compilation mechanism of source side injection, connecting the first and second polysilicon gates and applying a polysilicon gate voltage equal to a device threshold voltage to both of the first and second polysilicon gates, connecting the first and second control gates and applying the same control gate voltage higher than the device threshold voltage to both of the first and second control gates, and at the same time, applying a positive voltage to the drain, and applying a voltage of 0V to the source, to induce a relatively thin channel electron layer in a substrate area under the first and second polysilicon gates, and to induce a relatively thick channel electron layer in a substrate area under the first and second control gates, and, under the action of acceleration of the positive voltage of the drain, causing electrons induced from the polysilicon gates to be accelerated to generate hot electrons, and under the action of the high voltage of the control gates, injecting the hot electrons into the floating gates to complete the compilation.

Preferably, the first and second polysilicon gates, the first and second control gates, the first and second polysilicon floating gates and the insulating layers are disposed symmetrically in geometric dimensions, on the upper and lower sides of the substrate between the source and drain.

Preferably, the thickness of the polysilicon gates is 80~120 nm, the thickness of the control gates is 30~60 nm, and the thickness of the polysilicon floating gates is 30~50 nm; the insulating layers have a width of 2~5 nm between the polysilicon gates and the control gates, polysilicon floating gates, have a thickness of 2~5 nm between the polysilicon gates, polysilicon floating gates and the substrate, and have a thickness of 8~15 nm between the control gates and polysilicon floating gates; the thickness of the substrate is 15~30 nm, the length of the channel is not greater than 50 nm, and the extended length of the source and drain is 8~15 nm.

Preferably, the material of the polysilicon gates, control gates and polysilicon floating gates is polysilicon, and the material of the insulating layers is silicon dioxide.

Preferably, when the floating gate flash memory device performs compilation, the first and second polysilicon gates are connected and are both applied with the same polysilicon gate voltage of 4~5V, the first and second control gates are connected and are both applied with the same control gate voltage of 9~12V, and at the same time, a voltage of 5~6V is applied to the drain, and a voltage of 0V is applied to the source.

The beneficial effects of the present invention are in that: the floating gate flash memory device of the present invention utilizes a double-gate structure, can achieve a memory of single bit, effectively decrease the dimension of the floating gate flash memory, improve the integration level and storage density per unit area, can solve the short channel effects such as the problem of threshold voltage drift which follow subsequently, while reducing the critical dimension of the flash memory; and can solve the problems such as the poor programming efficiency of the floating gate flash memory and the high programming current power consumption, by using the compilation mechanism of source side injection.

DETAILED DESCRIPTION OF THE EMBODIMENTS

Figure 1:
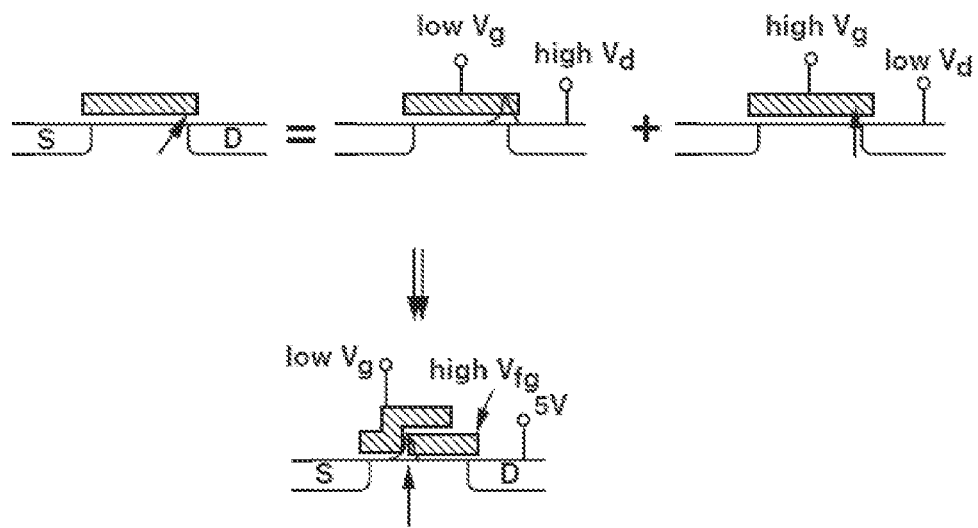
FIG. 1 is a schematic principle diagram of an existing floating gate flash memory using SSI as a compilation mechanism.

The specific embodiments of the present invention will be explained in further detail below with reference to the accompanying drawings.

It should be noted that, in the following specific embodiments, when the embodiments of the present invention are described in detail, in order to clearly illustrate the structure of the present invention to facilitate the explanation, particularly for the structures in the drawings, the drawing is not made in accordance with the general ratio, and local enlargement, deformation and simplification processing are made. Therefore, it should be avoided to understand this as a limitation on the present invention.

Figure 2:
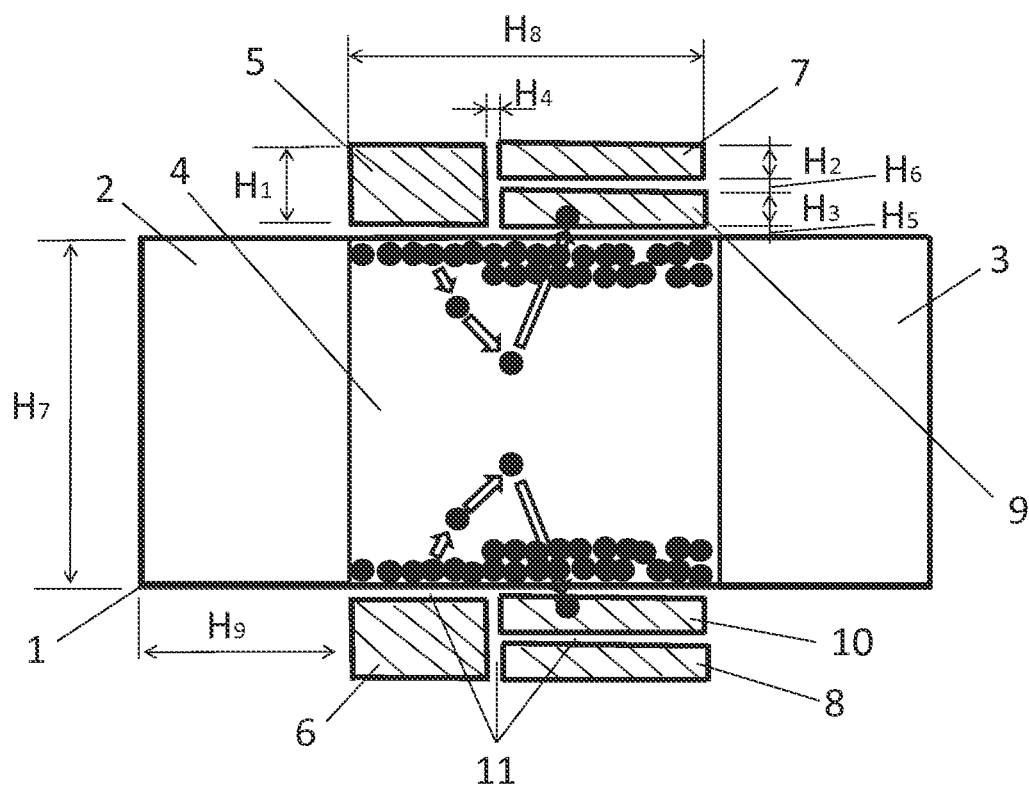
FIG. 2 is a schematic structure diagram of a floating gate flash memory device of an embodiment of the present invention.

In the specific embodiments of the present invention below, referring to FIG. 2, FIG. 2 is a schematic structure diagram of a floating gate flash memory device of an embodiment of the present invention. As shown in FIG. 2, a floating gate flash memory device of the present invention comprises: a semiconductor substrate 1 which can be of a cylindrical structure, includes an N-type doped source 2 and drain 3 located at both ends, and a P-type silicon channel 4 located in the middle; and includes a first polysilicon gate 5, a first control gate 7 and a second polysilicon gate 6, a second control gate 8 which are respectively located in parallel on the upper and lower sides of the substrate 1 between the source 2 and drain 3, first and second polysilicon floating gates 9, 10 being respectively provided between the first and second control gates 7, 8 and the substrate 1, insulating layers 11 being respectively provided between the polysilicon gates, control gates, polysilicon floating gates and substrate. Wherein the polysilicon gates 5, 6 are disposed near the side of the source 2, and the control gates 7, 8 and polysilicon floating gates 9, 10 are disposed near the side of the drain 3.

As a preferred embodiment, the first and second polysilicon gates 5 and 6, the first and second control gates 7 and 8, the first and second polysilicon floating gates 9 and 10 and the insulating layers 11 are disposed symmetrically in geometric dimensions, on the upper and lower sides of the substrate 1 between the source 2 and the drain 3. Further alternatively, the first and second polysilicon gates 5, 6 symmetrically have the same thickness H1 between 80~120 nm; the first and second control gates 7, 8 symmetrically have the same thickness H2 between 30~60 nm; the polysilicon floating gates 9, 10 symmetrically have the same thickness H3 between 30~50 nm; the insulating layers 11 have a width H4 of 2~5 nm between the polysilicon gates and the control gates, polysilicon floating gates, have a thickness H5 of 2~5 nm between the polysilicon gates, polysilicon floating gates and the substrate1, and have a thickness H6 of 8~15 nm between the control gates and polysilicon floating gates; the thickness H7 of the substrate 1 (silicon film) is 15~30 nm, the length H8 of the channel 4 is not greater than 50 nm, and the extended length H9 of the source and drain is 8~15 nm. For instance, as an example, the respective portions of the device can be processed to be as follows: the thickness H1 of the first and second polysilicon gates is 90 nm, the thickness H2 of the first and second control gates is 40 nm, and the thickness H3 of the first and second polysilicon floating gates is 40 nm; the width H4 of the insulating layer between the polysilicon gates and the control gates or the floating gates is 4 nm, the thickness H5 of the insulating layer between the polysilicon gates or the floating gates and the substrate is 3 nm, and the thickness H6 of the insulating layer between the control gates and the floating gates is 10 nm; the thickness H7 of the substrate silicon film is 20 nm, the channel length H8 of the device is 50 nm, and the length H9 extended by both of the source and the drain is 10 nm.

As a preferred embodiment, the material of all of the polysilicon gates 5 and 6, control gates 7 and 8, and polysilicon floating gates 9 and 10 is polysilicon, and the material of the insulating layers 11 is silicon dioxide.

The double-gate structure of the device of the present invention described above can effectively eliminate the problem of threshold voltage drift caused by the dimension reduction of the floating gate flash memory. Additionally, the device of the present invention has a manufacturing process that is not complicated, and can be produced in a general semiconductor manufacturing company.

The compilation method of the present invention will be further explained below with reference to FIG. 2. As shown in FIG. 2, the black dots in the illustrated channel region represent the electrons. When compilation is performed on the floating gate flash memory device of the present invention described above, the compilation method comprises: with a compilation mechanism of source side injection (SSI), connecting the first and second polysilicon gates 5, 6 together and applying the same voltage to the first and second polysilicon gates 5, 6, and also connecting the first and second control gates 7, 8 together and applying the same voltage to the first and second control gates 7, 8; applying a low voltage equal to a device threshold voltage to the first and second polysilicon gates 5, 6, and applying a high voltage much higher than the device threshold voltage to the first and second control gates 7, 8; at the same time, applying a positive high voltage to the drain 3, and applying a voltage of 0V to the source 2. The compilation principle of the present invention is as follows: the voltage applied to the first and second polysilicon gates is just equal to the threshold voltage, and can induce a relatively thin channel electron layer (exemplarily indicated by a single-layer electron layer in the FIG. 2) in a substrate area under them; the voltage applied to the first and second control gates is much higher than the device threshold voltage, and can induce a relatively thick channel electron layer (exemplarily indicated by a double-layer electron layer in the FIG. 2) in a substrate area under them; the high voltage applied to the drain can accelerate electrons induced under the first and second polysilicon gates, generate hot electrons having sufficient energy, and under the action of the high voltage of the first and second control gates, inject the hot electrons into the first and second polysilicon floating gates to complete the compilation (as pointed by the hollow arrows in the FIG. 2).

As an alternative embodiment, when compilation is performed on the floating gate flash memory device, the first and second polysilicon gates 5, 6 are connected and are both applied with the same polysilicon gate voltage of 4~5V that is equal to the device threshold voltage (different devices may have different threshold voltages), and the first and second control gates 7, 8 are connected and are both applied with the same control gate voltage of 9~12V that is much higher than the device threshold voltage, and at the same time, a high voltage of 5~6V is applied to the drain 3, and a voltage of 0V is applied to the source 2. For instance, as an example, in programming, the polysilicon gates, the control gates and the polysilicon floating gates all use the same polysilicon as the material, and the first and second polysilicon gates are connected, and the first and second control gates are connected; then, a threshold voltage of 4V is applied to both of the first and second polysilicon gates, a high voltage of 9V is applied to both of the first and second control gates, a high voltage of 5V is applied to the drain, and a voltage of 0V is applied to the source. In this way, it is possible to induce a relatively thin channel electron layer in the substrate area under the first and second polysilicon gates, and to induce a relatively thick channel electron layer in the substrate area under the first and second control gates; the high voltage of 5V applied to the drain can accelerate the electrons induced under the first and second polysilicon gates, generate hot electrons having sufficient energy, and under the action of the high voltage of 9V of the first and second control gates, inject the hot electrons into the first and second polysilicon floating gates to complete the compilation.

In summary, the floating gate flash memory device of the present invention utilizes a double-gate structure, can achieve a memory of single bit, effectively decrease the dimension of the floating gate flash memory, improve the integration level and storage density per unit area, can solve the short channel effects such as the problem of threshold voltage drift which follow subsequently, while reducing the critical dimension of the flash memory; and can solve the problems such as the poor programming efficiency and high programming current power consumption of the floating gate flash memory, by using the compilation mechanism of source side injection.

The above is only a preferred embodiment of the present invention. The embodiment is not intended to limit the patent protection scope of the present invention. Therefore, all of the equivalent structural changes made using the contents of the specification and drawings of the present invention, should be encompassed in the protection scope of the present invention in a similar way.

The invention claimed is:

1. A floating gate flash memory device, comprising:
a semiconductor substrate which includes an N-type doped source and drain located at both ends, and a P-type silicon channel located in the middle; and
a first polysilicon gate, a first control gate and a second polysilicon gate and a second control gate which are respectively located in parallel on the upper and lower sides of the substrate between the source and drain, first and second polysilicon floating gates being respectively provided between the first and second control gates and the substrate, insulating layers being respectively provided between the polysilicon gates, control gates, polysilicon floating gates and substrate;
wherein, when the floating gate flash memory device performs compilation, by connecting the first and second polysilicon gates and applying a polysilicon gate voltage equal to a device threshold voltage to both of the first and second polysilicon gates, connecting the first and second control gates and applying a same control gate voltage to the first and second control gates which is higher than the device threshold voltage to both of the first and second control gates, and at the same time, applying a positive voltage to the drain, and applying a voltage of 0V to the source, a relatively thin channel electron layer is induced in a first area of the substrate under the first and second polysilicon gates, and a relatively thick channel electron layer is induced in a second area of the substrate under the first and second control gates, and, under the action of acceleration of the positive voltage of the drain, electrons induced from the polysilicon gates are accelerated to generate hot electrons, and under the action of the high voltage of the control gates, the hot electrons are injected into the floating gates to complete the compilation.

2. The floating gate flash memory device according to claim 1, wherein the first and second polysilicon gates, the first and second control gates, the first and second polysilicon floating gates and the insulating layers are disposed symmetrically in geometric dimensions, on the upper and lower sides of the substrate between the source and drain.

3. The floating gate flash memory device according to claim 1, wherein the thickness of the polysilicon gates is 80~120 nm.

4. The floating gate flash memory device according to claim 3, wherein the thickness of the polysilicon gates is 90 nm.

5. The floating gate flash memory device according to claim 1, wherein the thickness of the control gates is 30~60 nm.

6. The floating gate flash memory device according to claim 5, wherein the thickness of the control gates is 40 nm.

7. The floating gate flash memory device according to claim 1, wherein the thickness of the polysilicon floating gates is 30~50 nm.

8. The floating gate flash memory device according to claim 7, wherein the thickness of the polysilicon floating gates is 40 nm.

9. The floating gate flash memory device according to claim 1, wherein the insulating layers have a width of 2~5 nm between the polysilicon gates and the control gates, polysilicon floating gates, have a thickness of 2~5 nm between the polysilicon gates, polysilicon floating gates and the substrate, and have a thickness of 8~15 nm between the control gates and polysilicon floating gates; the thickness of the substrate is 15~30 nm, the length of the channel is not greater than 50 nm, and the extended length of the source and drain is 8~15 nm.

10. The floating gate flash memory device according to claim 9, wherein the insulating layers have a width of 4 nm between the polysilicon gates and the control gates, polysilicon floating gates, have a thickness of 3 nm between the polysilicon gates, polysilicon floating gates and the substrate, and have a thickness of 10 nm between the control gates and polysilicon floating gates; the thickness of the substrate is 20 nm, the length of the channel is not greater than 50 nm, and the extended length of the source and drain is 10 nm.

11. The floating gate flash memory device according to claim 1, wherein the material of the polysilicon gates, control gates and polysilicon floating gates is polysilicon, and the material of the insulating layers is silicon dioxide.

12. The floating gate flash memory device according to claim 2, wherein the material of the polysilicon gates, control gates and polysilicon floating gates is polysilicon, and the material of the insulating layers is silicon dioxide.

13. The floating gate flash memory device according to claim 1, wherein, when the floating gate flash memory device performs compilation, the first and second polysilicon gates are connected and are both applied with the same polysilicon gate voltage of 4~5V, the first and second control gates are connected and are both applied with the same control gate voltage of 9~12V, and at the same time, a voltage of 5~6V is applied to the drain, and a voltage of 0V is applied to the source.

14. A compilation method of a floating gate flash memory device, wherein the floating gate flash memory device comprises: a semiconductor substrate which has an N-type doped source and drain located at both ends, and a P-type silicon channel located in the middle; and a first polysilicon gate, a first control gate and a second polysilicon gate and a second control gate which are respectively located in parallel on the upper and lower sides of the substrate between the source and drain, first and second polysilicon floating gates being respectively provided between the first and second control gates and the substrate, insulating layers being respectively provided between the polysilicon gates, control gates, polysilicon floating gates and substrate;

the compilation method comprising: with a compilation mechanism of source side injection, connecting the first and second polysilicon gates and applying a polysilicon gate voltage equal to a device threshold voltage to both of the first and second polysilicon gates, connecting the first and second control gates and applying a same control gate voltage to the first and second control gates which is higher than the device threshold voltage to both of the first and second control gates, and at the same time, applying a positive voltage to the drain, and applying a voltage of 0V to the source, to induce a relatively thin channel electron layer in a first area of the substrate under the first and second polysilicon gates, and to induce a relatively thick channel electron layer in a second area of the substrate under the first and second control gates, and, under the action of acceleration of the positive voltage of the drain, causing electrons induced from the polysilicon gates to be accelerated to generate hot electrons, and under the action of the high voltage of the control gates, injecting the hot electrons into the floating gates to complete the compilation.

15. The method according to claim 14, wherein the first and second polysilicon gates, the first and second control gates, the first and second polysilicon floating gates and the insulating layers are disposed symmetrically in geometric dimensions, on the upper and lower sides of the substrate between the source and the drain.

16. The method according to claim 14, wherein the thickness of the polysilicon gates is 80~120 nm, the thickness of the control gates is 30~60 nm, and the thickness of the polysilicon floating gates is 30~50 nm; the insulating layers have a width of 2~5 nm between the polysilicon gates and the control gates, polysilicon floating gates, have a thickness of 2~5 nm between the polysilicon gates, polysilicon floating gates and the substrate, and have a thickness of 8~15 nm between the control gates and polysilicon floating gates; the thickness of the substrate is 15~30 nm, the length of the channel is not greater than 50 nm, and the extended length of the source and drain is 8~15 nm.

17. The method according to claim 14, wherein the material of the polysilicon gates, control gates and polysilicon floating gates is polysilicon, and the material of the insulating layers is silicon dioxide.

18. The method according to claim 14, wherein, when the floating gate flash memory device performs compilation, the first and second polysilicon gates are connected and are both applied with the same polysilicon gate voltage of 4~5V, the first and second control gates are connected and are both applied with the same control gate voltage of 9~12V, and at the same time, a voltage of 5~6V is applied to the drain, and a voltage of 0V is applied to the source.

* * * * *